United States Patent
Zhu et al.

(10) Patent No.: US 12,198,980 B2
(45) Date of Patent: Jan. 14, 2025

(54) METAL INTERCONNECTION STRUCTURE AND MANUFACTURING METHOD THEREOF

(71) Applicant: SHANGHAI INTEGRATED CIRCUIT MANUFACTURING INNOVATION CENTER CO., LTD., Shanghai (CN)

(72) Inventors: Bao Zhu, Shanghai (CN); Rui Yin, Shanghai (CN); Wei Zhang, Shanghai (CN)

(73) Assignee: SHANGHAI INTEGRATED CIRCUIT MANUFACTURING INNOVATION CENTER CO., LTD., Shanghai (CN)

( * ) Notice: Subject to any disclaimer, the term of this patent is extended or adjusted under 35 U.S.C. 154(b) by 435 days.

(21) Appl. No.: 17/570,563

(22) Filed: Jan. 7, 2022

(65) Prior Publication Data
US 2023/0049704 A1 Feb. 16, 2023

(30) Foreign Application Priority Data
Aug. 12, 2021 (CN) .......................... 202110924471.1

(51) Int. Cl.
*H01L 21/768* (2006.01)
*H01L 23/528* (2006.01)

(52) U.S. Cl.
CPC .. *H01L 21/76843* (2013.01); *H01L 21/76802* (2013.01); *H01L 21/76877* (2013.01); *H01L 23/528* (2013.01)

(58) Field of Classification Search
CPC ......... H01L 23/76843; H01L 23/76802; H01L 23/76877; H01L 23/528
See application file for complete search history.

(56) References Cited

U.S. PATENT DOCUMENTS

| 2009/0152736 | A1* | 6/2009 | Watanabe | ......... H01L 21/76864 257/E23.173 |
| 2010/0301489 | A1* | 12/2010 | Seidel | ................. H01L 21/7682 257/E21.585 |
| 2014/0252636 | A1* | 9/2014 | Chen | ................. H01L 21/76829 257/773 |

\* cited by examiner

*Primary Examiner* — Peniel M Gumedzoe
(74) *Attorney, Agent, or Firm* — Ziegler IP Law Group LLC.

(57) ABSTRACT

The present invention provides a metal interconnection structure and a manufacturing method thereof, the metal interconnection structure includes: metal interconnection lines disposed at intervals, first metal layers respectively disposed on the metal interconnection lines; second metal layers respectively disposed on the first metal layers; dielectric layers disposed on both sides of the first metal layer and the second metal layer and having a gap with both the first metal layer and the second metal layer; and a metal diffusion covering layer covering the dielectric layer and the second metal layer. In the present invention, by disposing the dielectric layer on both sides of the first metal layer and the second metal layer, and the dielectric layer has a gap with both the first metal layer and the second metal layer, and the formed metal interconnection structure reduces parasitic capacitance due to the gap, and the gaps existing between the first metal layer and the dielectric layer and between the second metal layer and the dielectric layer can further reduce the diffusion of metal ions to the dielectric layer.

7 Claims, 8 Drawing Sheets

METAL INTERCONNECTION STRUCTURE AND MANUFACTURING METHOD THEREOF

FIELD OF TECHNOLOGY

The present invention relates to the technical field of integrated circuits, in particular to a metal interconnection structure and a manufacturing method thereof.

BACKGROUND

With the rapid development of integrated circuits, the feature size of transistors is decreasing, and the number of transistors piled up on a single chip is increasing, which leads to the continuous improvement of the integration of chips. In order to realize metal interconnection with high integration, the number of metal wiring layers is increasing, which leads to the increase of metal wire resistance, interline capacitance and interlayer capacitance, and thus causing the increase of the resistor-capacitor (RC) delay time, series noise and power consumption and so on.

To solve the above problems, at present, on the one hand, the bottom copper interconnection line is used instead of the aluminum interconnection line to reduce the existing resistance of the circuit, on the other hand, the dielectric material with a low dielectric constant, such as SiCOH, is used instead of silicon dioxide to reduce a parasitic capacitance between metal interconnection layers. But with the continuous advancement of technology, the transverse dimensions of trenches and vias in metal interconnection dual damascene process continue to shrink, that is to say, an aspect ratio of trenches and vias is constantly increasing. In order to ensure the relative volume of copper interconnection lines remains unchanged, thicknesses of a copper diffusion barrier layer and a copper adhesion layer will be continuously reduced, and the barrier property of the copper diffusion barrier layer will be greatly weakened. Meanwhile, low dielectric materials can not further reduce parasitic capacitance.

SUMMARY

An object of the present invention is to provide a metal interconnection structure and a manufacturing method thereof, which ensures the integration of the structure and reduces the parasitic capacitance formed by the metal interconnection structure and the diffusion of metal ions to the dielectric materials.

To achieve the above object, in a first aspect, the present invention provides a metal interconnection structure, which includes:

metal interconnection lines disposed at intervals, first metal layers respectively disposed on the metal interconnection lines; second metal layers respectively disposed on the first metal layers; dielectric layers disposed on both sides of the first metal layer and the second metal layer and having a gap with both the first metal layer and the second metal layer; and a metal diffusion covering layer covering the dielectric layer and the second metal layer.

The metal interconnection structure provided by the embodiment of the present invention has the beneficial effects that: by disposing a dielectric layer on both sides of the first metal layer and the second metal layer, and the dielectric layer has a gap with both the first metal layer and the second metal layer, and the formed metal interconnection structure reduces parasitic capacitance due to the gap, and the gaps existing between the first metal layer and the dielectric layer and between the second metal layer and the dielectric layer can further reduce the diffusion of metal ions to the dielectric layer.

In one possible implementation, the metal interconnection line includes: an insulating dielectric substrate with trenches disposed at intervals on an upper surface thereof; a first barrier layer covering an inner side surface and a bottom surface of the trench; a bottom metal covering the first barrier layer and filling the trench; and the first metal layer disposed on an upper surface of the bottom metal. It has the beneficial effect that the structural integrity of the metal interconnection line is ensured.

In one possible implementation, the metal interconnection line also includes a second barrier layer disposed between the dielectric layer and the metal interconnection line to separate the dielectric layer from the metal interconnection line. It has the beneficial effect that the possibility of metal ions diffusing to the dielectric layer is further reduced.

In a second aspect, embodiments of the present invention provide a manufacturing method of a metal interconnection structure, the method includes:

step S101: providing metal interconnection lines disposed at intervals;

step S102: disposing first metal layers corresponding to the metal interconnection lines;

step S103, disposing second metal layers on the first metal layers;

step S104: disposing dielectric layers on both sides of the first metal layer and the second metal layer, respectively, and the dielectric layer having gaps with both the first metal layer and the second metal layer; and step S105: covering the dielectric layer and the second metal layer with a metal diffusion covering layer.

The manufacturing method of a metal interconnection structure provided by the embodiment of the present invention has the beneficial effects that: by disposing a dielectric layer on both sides of the first metal layer and the second metal layer, and the dielectric layer has a gap with both the first metal layer and the second metal layer, and the formed metal interconnection structure reduces parasitic capacitance due to the gaps, and the gaps existing between the dielectric layer and the first metal layer and between the dielectric layer and the second metal layer can further reduce the diffusion of metal ions to the dielectric layer.

In one possible implementation, the step S101 includes providing an insulating dielectric substrate, trenches distributed at intervals disposed on an upper surface of the insulating dielectric substrate; generating a first barrier layer in the trench, the first barrier layer covering a side surface and a bottom surface of the trench; and disposing a bottom metal on the first barrier layer, and the bottom metal filling the trench to form the metal interconnection line. It has the beneficial effect that a structurally complete metal interconnection line is prepared, and the integration degree of the metal interconnection structure is improved.

In a possible implementation, the step S102 includes: growing a first sacrificial layer mask on the upper surface of the metal interconnection line, then defining a via corresponding to the metal interconnection line on the first sacrificial layer mask, the via conducting to the metal interconnection line; and disposing the first metal layer in the via. It has the beneficial effect that by machining the via first, it facilitates the disposing of the first metal layer in the via and reduces the complexity of the process.

In one possible implementation, the step S103 includes: growing a second sacrificial layer mask on the upper surfaces of the first metal layer and the first sacrificial layer mask, and disposing an opening corresponding to the via on the second sacrificial layer mask, a bottom end of the opening extending to the first metal layer; and disposing the second metal layer in the opening, and the second metal layer being connected with the first metal layer. It has the beneficial effect that by disposing the opening on the second sacrificial layer mask first and disposing the second metal layer in the opening, it further reduces the process complexity of preparing the metal interconnection structure and accelerates the production efficiency.

In one possible implementation, the step S104 includes: removing the first sacrificial layer mask and the second sacrificial layer mask, then generating a second barrier layer on surfaces of the first metal layer and the second metal layer, and on upper surfaces of the insulating dielectric substrate and the metal interconnection line, and then generating the dielectric layer on the second barrier layer. It has the beneficial effect that by disposing the second barrier layer, the metal ions are prevented from diffusing into the dielectric layer.

In one possible implementation, after the generating of the dielectric layer on the second barrier layer, the method includes: removing the second barrier layer and the dielectric layer above the upper surface of the second metal layer, and then removing the second barrier layer between the second metal layer and the dielectric layer and between the first metal layer and the dielectric layer to form the gap. It has the beneficial effect that the integration of the metal interconnection structure is ensured while the possibility of copper ions diffusing into the dielectric layer is reduced.

In one possible implementation, the transverse dimensions of both the trench and the opening are larger than a diameter of the via. It has the beneficial effect that the product integration is improved and the conductivity of the circuit is ensured.

Figure 1:
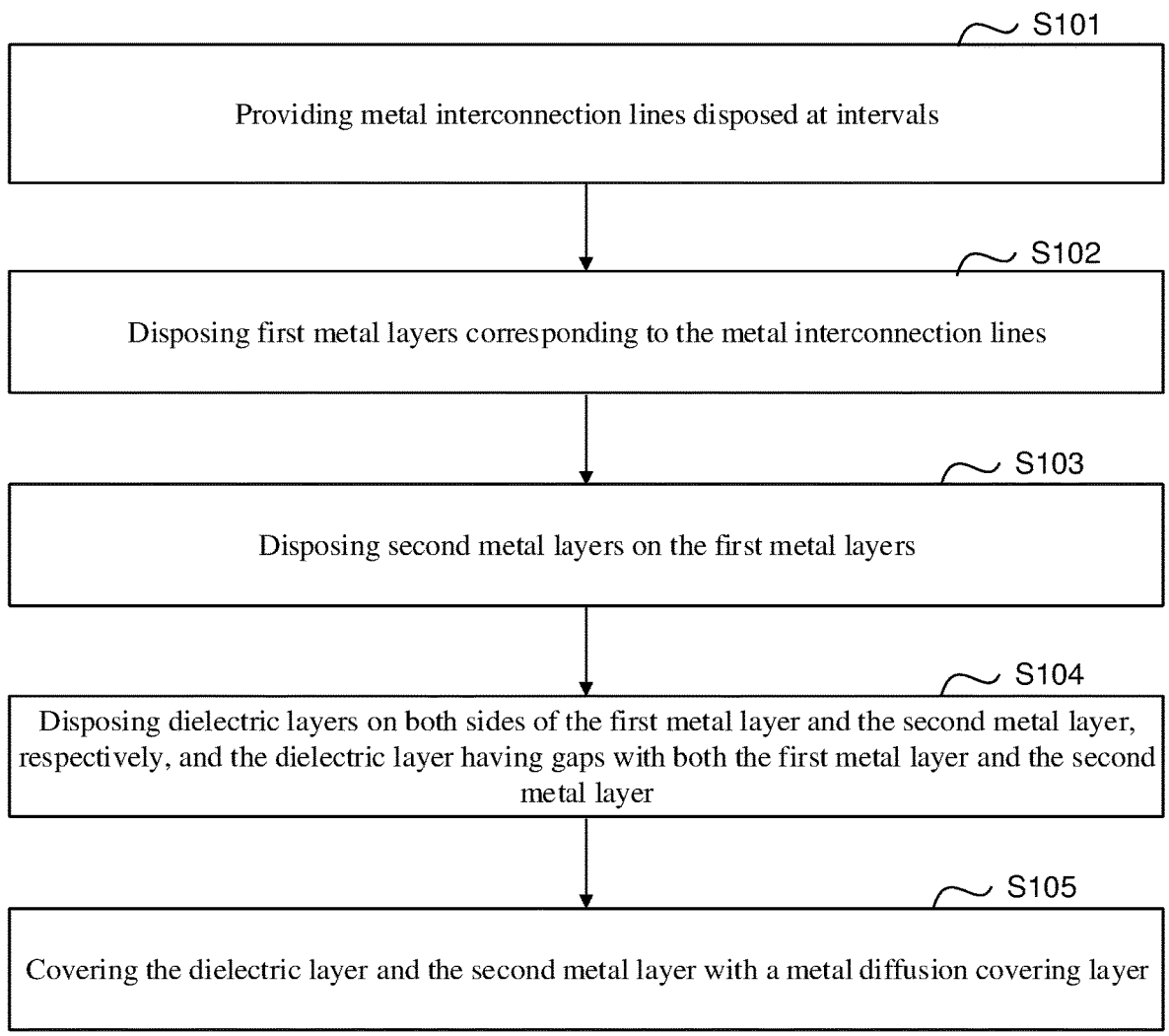
FIG. 1 is a flowchart of a manufacturing method of a metal interconnection structure provided by an embodiment of the present invention.

Reference signs:

metal interconnection line 200, insulating dielectric substrate 201, first barrier layer 202, bottom metal 203, first sacrificial layer mask 204, first metal layer 205, second sacrificial layer mask 206, second metal layer 207, second barrier layer 208, dielectric layer 209, metal diffusion covering layer 210 and first photoresist 300.

DESCRIPTION OF THE EMBODIMENTS

In order to make objectives, technical solutions, and advantages of the present invention clearer, the technical solutions in the invention are described clearly and completely in the following with reference to accompanying drawings in the embodiments of the present invention. Apparently, the described embodiments are only part rather than all of the embodiments of the present invention. Based on the embodiments of the invention, all the other embodiments obtained by those of ordinary skill in the art without inventive effort are within the scope of the invention. Unless otherwise mentioned, all technical and scientific terms used herein have the same meaning as commonly understood by one of ordinary skill in the art to which the invention belongs. The term "including" and the like as used herein means that the elements or articles appearing before the term encompass the enumerated elements or articles appearing after the term and their equivalents, without excluding other elements or articles.

With the rapid development of integrated circuits, the integration of semiconductors continues to increase, leading to an increasing depth ratio of trenches and vias in the integrated circuit structure. The multilayer wiring of the metal interconnection line leads to the increase of metal wire resistance, interline capacitance and interlayer capacitance, and thus causes the increase of the RC delay time, series noise and power consumption and so on. Moreover, a depth ratio of the trench and the via increases continuously, which makes the process complexity of preparing integrated circuits increase continuously, affects the production progress of products and increases the production cost.

At present, in order to reduce the resistance of metal conductors, copper is usually used as a circuit connection line, in the manufacturing method of a metal interconnection structure provided by the embodiment of the present invention, the metal used in the manufacturing method is copper, so the materials containing metals referred to below are all copper materials. Referring to FIG. 1, the method includes:

step S101: providing metal interconnection lines disposed at intervals.

Figure 2:
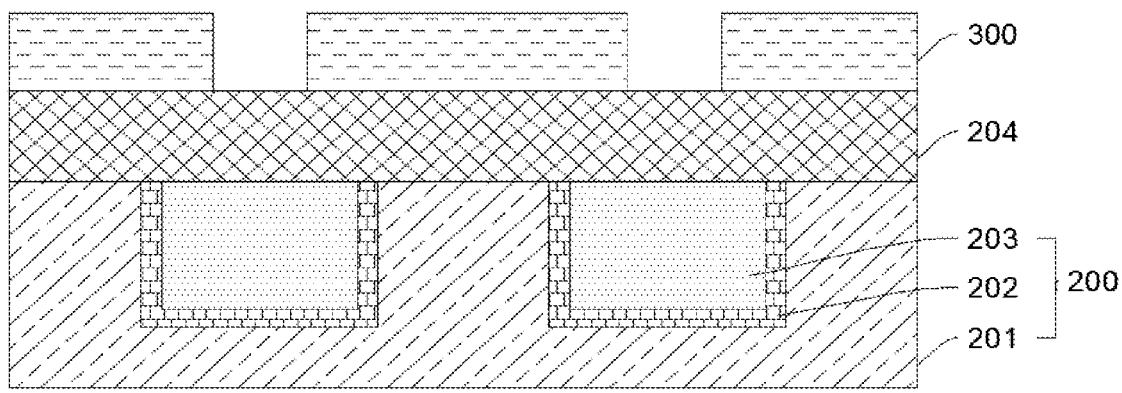
FIG. 2 is a structural schematic diagram after disposing a first sacrificial layer mask and a first photoresist on the metal interconnection structure and forming a via pattern on the first photoresist according to an embodiment of the present invention.

In this step, referring to FIG. 2, a metal interconnection line 200 is provided, which includes an insulating dielectric substrate 201, a first barrier layer 202 and a bottom metal 203. Specifically, the metal interconnection line 200 in the present application is formed by defining trenches distributed at intervals on an upper surface of the insulating dielectric substrate 201 in advance, then filling the trenches with the first barrier layer 202 and the bottom metal 203 in turn, wherein the first barrier layer 202 covers a side surface and a bottom surface of the trench, and the bottom metal 203 fills the trench to be flush with the upper surface of the insulating dielectric substrate 201, so that an overall structure of the metal interconnection line 200 is complete.

Step S102: disposing first metal layers corresponding to the metal interconnection lines.

Figure 3:
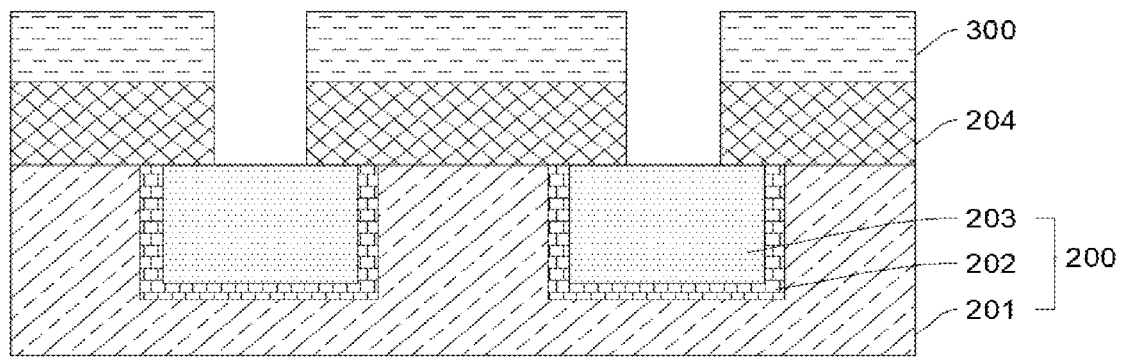
FIG. 3 is a structural schematic diagram after etching a via on the first sacrificial layer mask according to an embodiment of the present invention.
Figure 4:
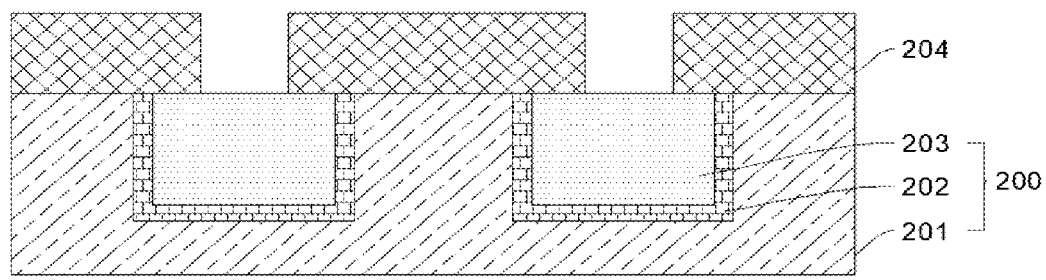
FIG. 4 is a structural schematic diagram after removing the first photoresist according to an embodiment of the present invention.
Figure 5:
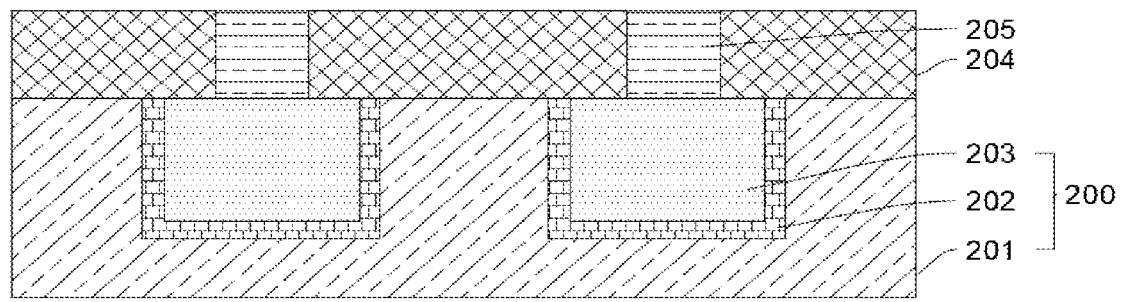
FIG. 5 is structural a schematic diagram after generating a first metal layer in the via according to an embodiment of the present invention.

Specifically, referring to FIG. 2, a first sacrificial layer mask 204 is deposited on an upper surface of the metal interconnection line 200 structure using a chemical vapor deposition process, then a first photoresist 300 is coated on the first sacrificial layer mask 204, and a via pattern is formed by an exposure and development process. Further, referring to FIG. 3, the first photoresist 300 is used as a mask, a patterning process is performed by an etching process to etch a via on the first sacrificial layer mask 204, and a bottom of the via is conducted to the upper surface of the metal interconnection line 200, so that the upper surface of the metal interconnection line 200 is partially exposed. Referring to FIG. 4, the first photoresist 300 is then removed by dissolving or ashing in a solvent. Referring to FIG. 5, the bottom metal 203 is then plated in the via, and the bottom metal 203 is filled into the via to form the first metal layer 205. Since plating the bottom metal 203 on the first sacrificial layer mask 204 would be very difficult, the bottom metal 203 is not present on the upper surface of the first sacrificial layer mask 204.

In this step, by etching the via first facilitates the disposing of the first metal layer 205 in the via, which reduces the complexity of the process.

Step S103, disposing second metal layers on the first metal layers.

Figure 6:
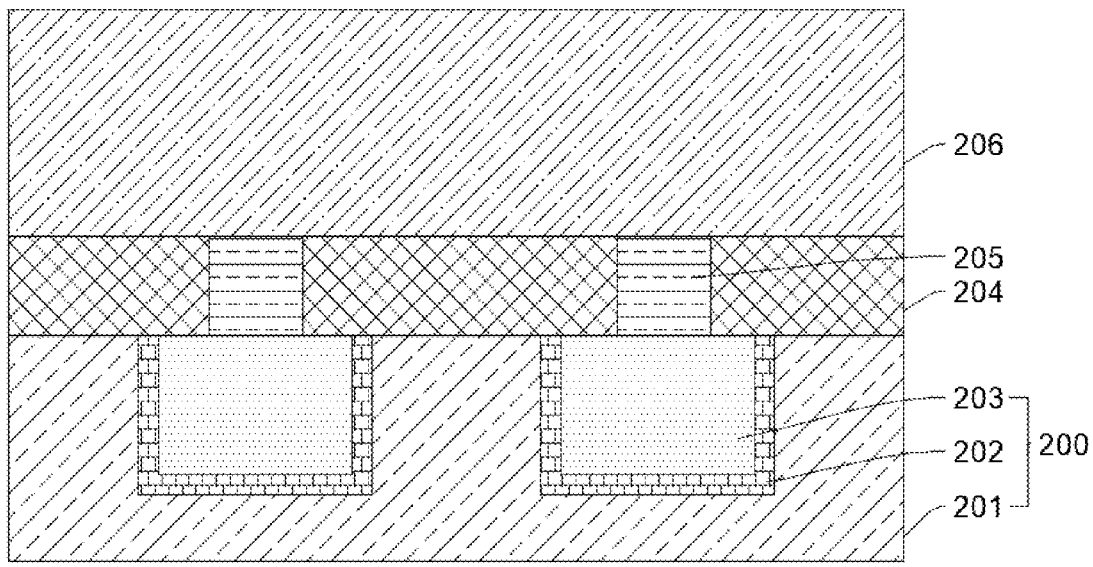
FIG. 6 is a structural schematic diagram of after generating a second sacrificial layer mask according to an embodiment of the present invention.
Figure 7:
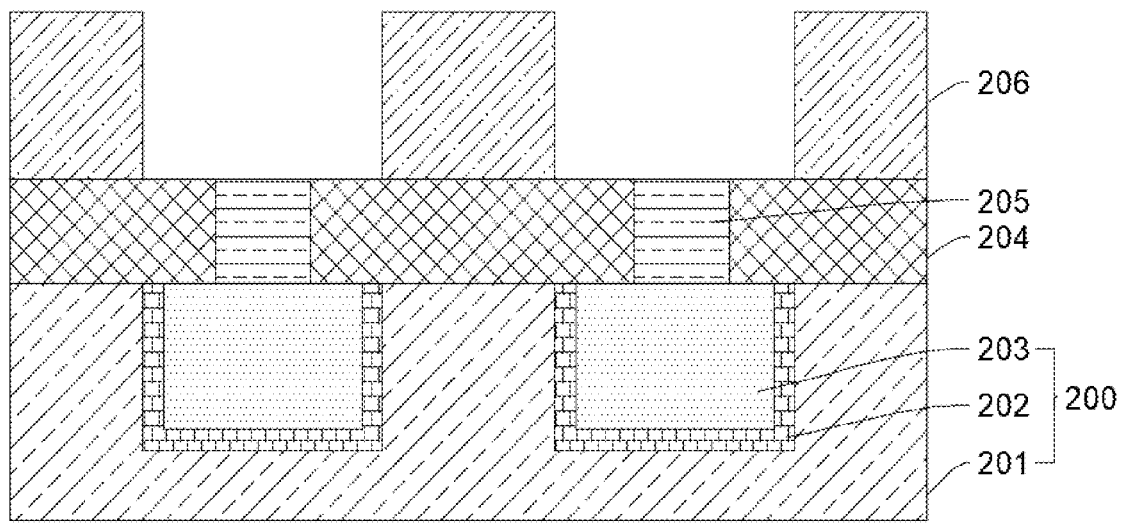
FIG. 7 is a structural schematic diagram after forming an opening according to an embodiment of the present invention.

In this step, referring to FIG. 6, a second sacrificial layer mask 206 is first deposited using the chemical vapor deposition process. Referring to FIG. 7, a second photoresist is then coated on the second sacrificial layer mask 206, an opening pattern is formed on the second photoresist by a photolithography process, and then the opening pattern is processed by an etching process, so that an opening is defined on the second sacrificial layer mask 206, and a plurality of openings are disposed corresponding to the vias, a bottom end of each opening extends to the first metal layer 205, and the upper surface of the first metal layer 205 can be exposed through the opening.

Figure 8:
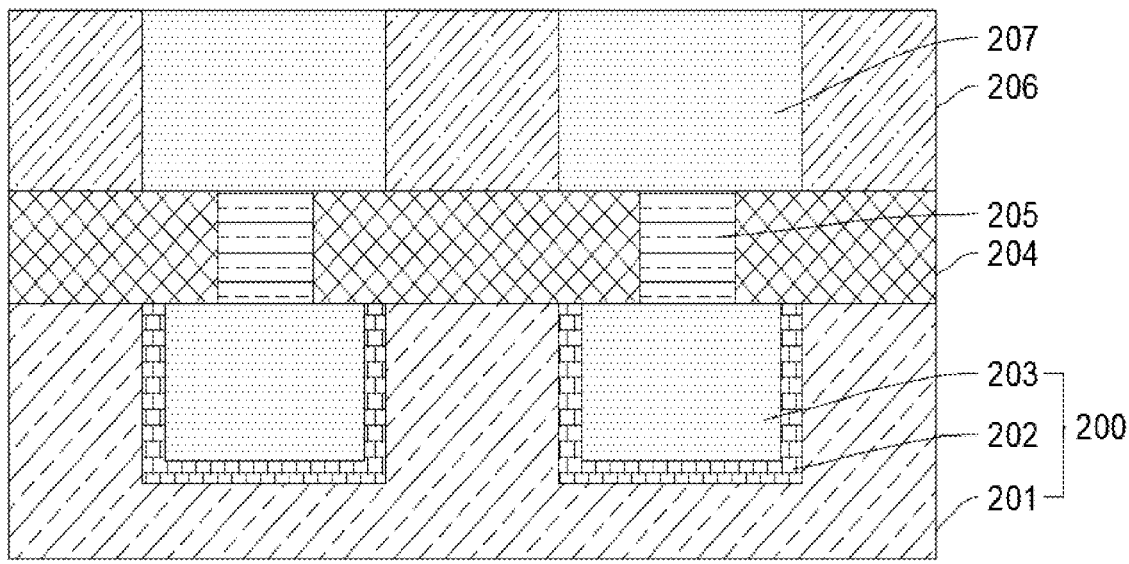
FIG. 8 is a structural schematic diagram after generating a second metal layer in the opening according to an embodiment of the present invention.

Further, referring to FIG. 8, the second photoresist is removed by dissolving or ashing in a solvent, and finally the first metal layer 205 exposed at the bottom of the opening is used as a seed layer of the bottom metal 203, and the bottom metal 203 is plated in the opening to form a second metal layer 207, so that the second metal layer 207 is connected with the first metal layer 205. Specifically, the second metal layer 207 is formed by first plating a layer of the bottom metal 203 thin film on the surface of the first metal layer 205, then followed by plating in a direction of both sides of the bottom metal 203 thin film transversely up to both sides of the opening, and finally plating the bottom metal 203 in a direction of the bottom metal 203 thin film longitudinally up to the uppermost end of the opening. In this step, it is easy to dispose the second metal layer 207 in the opening, and by generating the via before generating the opening, the overall process complexity is further reduced, and the production efficiency is improved.

Step S104: disposing dielectric layers on both sides of the first metal layer and the second metal layer, respectively, and the dielectric layer having gaps with both the first metal layer and the second metal layer.

Figure 9:
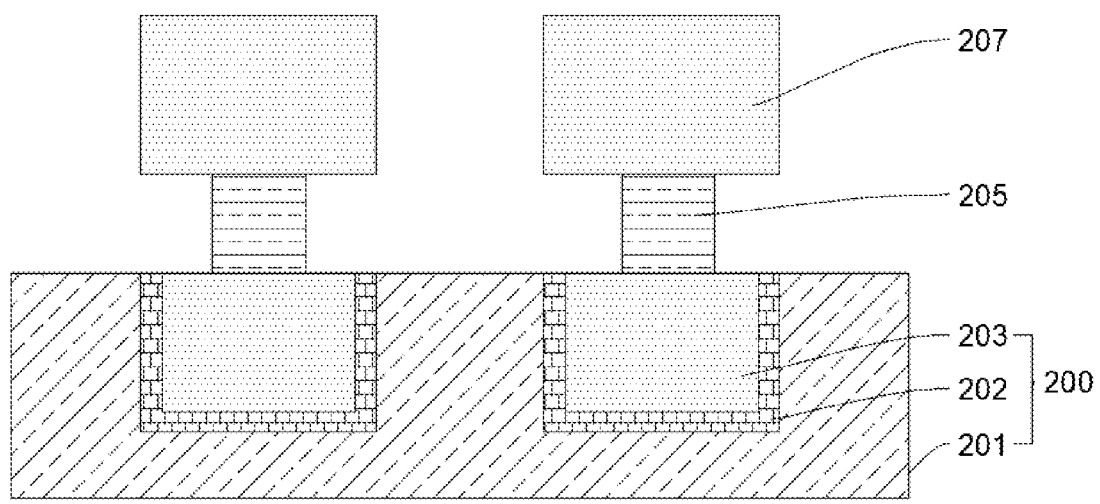
FIG. 9 is a structural schematic diagram after removing the first sacrificial layer mask and the second sacrificial layer mask according to an embodiment of the present invention.
Figure 10:
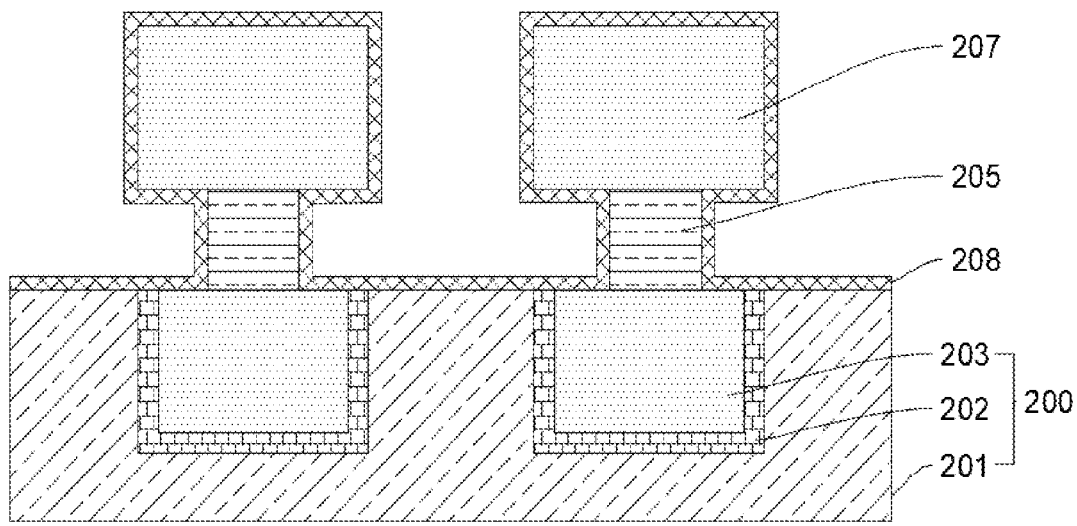
FIG. 10 is a structural schematic diagram after generating a second barrier layer according to an embodiment of the present invention.
Figure 11:
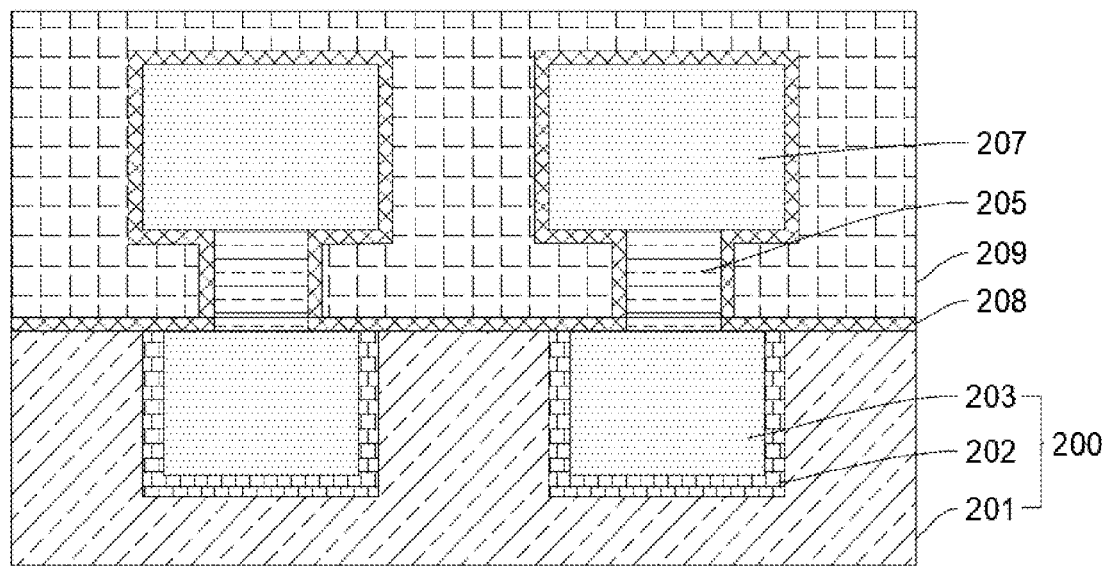
FIG. 11 is a structural schematic diagram after generating a dielectric layer on the second barrier layer according to an embodiment of the present invention.

In this step, referring to FIG. 9, the first sacrificial layer mask 204 and the second sacrificial layer mask 206 are removed by wet etching. Referring to FIG. 10, a second barrier layer 208 is then generated on the surfaces of the first metal layer 205 and the second metal layer 207 and on the upper surfaces of the insulating dielectric substrate 201 and the metal interconnection line 200. Referring to FIG. 11, a dielectric layer 209 is then generated on the second barrier layer 208.

Figure 12:
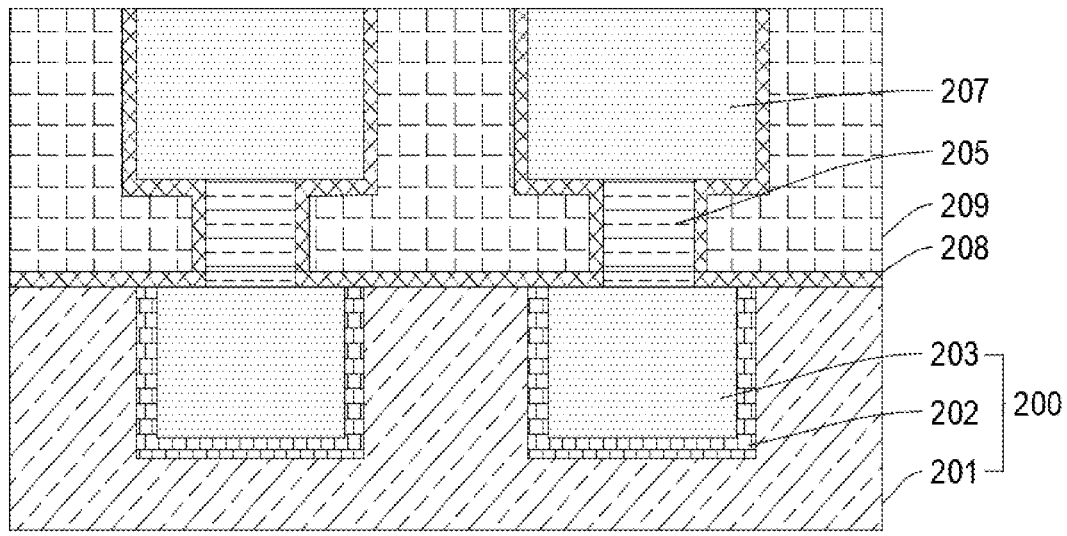
FIG. 12 is a structural schematic diagram after removing the second barrier layer and the dielectric layer above an upper surface of the second metal layer according to an embodiment of the present invention.
Figure 13:
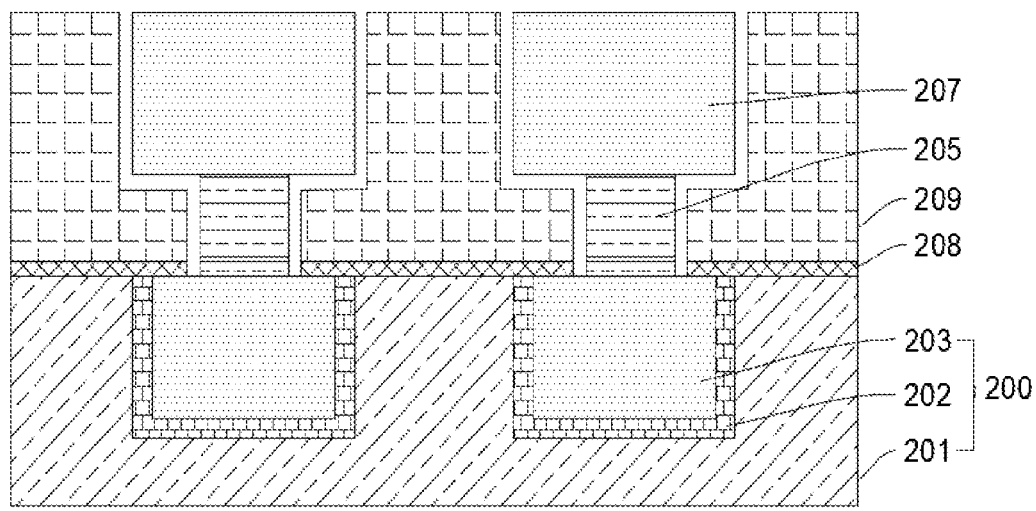
FIG. 13 is a structural schematic diagram after removing the second barrier layer between the second metal layer and the dielectric layer and between the first metal layer and the dielectric layer to form gaps according to an embodiment of the present invention.

Further, referring to FIG. 12, the second barrier layer 208 and the dielectric layer 209 above the upper surface of the second metal layer 207 are removed by chemical mechanical polishing. Referring to FIG. 13, the second barrier layer 208 between the second metal layer 207 and the dielectric layer 209 and between the first metal layer 205 and the dielectric layer 209 are then removed using a wet etching process to form gaps.

In this step, parasitic capacitance existing in the metal interconnection structure is reduced by forming the gap, and the gaps existing between the second metal layer 207 and the dielectric layer 209 and between the first metal layer 205 and the dielectric layer 209 can further reduce the possibility of copper ion diffusion to the dielectric layer 209.

Step S105: covering the dielectric layer and the second metal layer with a metal diffusion covering layer.

Figure 14:
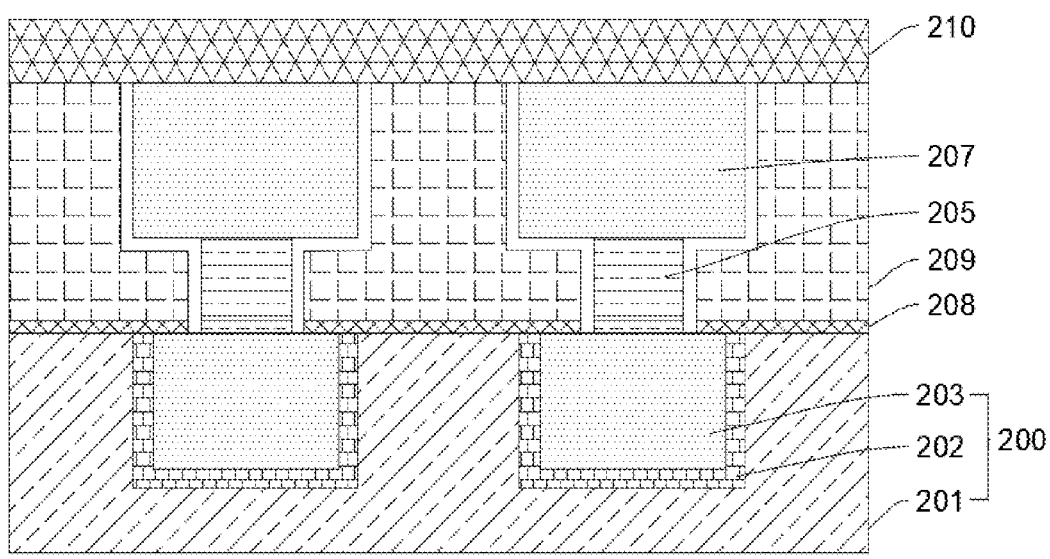
FIG. 14 is a structural schematic diagram of a metal interconnection structure according to an embodiment of the present invention.

In this step, referring to FIG. 14, a metal diffusion covering layer 210 is grown on the upper surfaces of the dielectric layer 209 and the second metal layer 207 by a physical vapor deposition method, thereby completing a manufacturing process of the entire metal interconnection structure.

In this embodiment, the dielectric layer 209 is disposed on both sides of the first metal layer 205 and the second metal layer 207, and the dielectric layer 209 has a gap with both the first metal layer 205 and the second metal layer 207, so that the parasitic capacitance in the metal interconnection structure is reduced. Moreover, the gap between the first metal layer 205 and the dielectric layer 209 and between the second metal layer 207 and the dielectric layer 209 can further reduce the copper ion diffusion to the dielectric layer 209, and the overall process complexity of manufacturing the metal interconnection structure can be reduced by generating vias first and then generating openings and sequentially disposing the first metal layer 205 and the second metal layer 207.

It should be noted that amorphous carbon is employed as the first sacrificial layer mask 204 and the second sacrificial layer mask 206 in this embodiment, but the present invention is not limited thereto, and germanium or germanium dioxide can also be selected. In addition, dry etching such as ion milling etching, plasma etching, reactive ion etching or laser ablation can be selected as the etching process used in the present embodiment, and the patterning process can also be performed by wet etching using an etchant solution.

Further, in this embodiment, the first barrier layer 202 and the second barrier layer 208 may be made of $Si_3N_4$, TaN, TiN or ZiN, and thicknesses of the first barrier layer 202 and the second barrier layer 208 are within 1 to 3 nm, the dielectric layer 209 may be made of $SiO_2$, SiCOF or SiCOH, and the metal diffusion cover layer 210 may be made of SiCN, SiC, SiN, Co, CoWP or CuSiN.

In another embodiment disclosed by the present invention, a metal interconnection structure, referring to FIG. 14, includes metal interconnection lines 200 disposed at intervals, a first metal layer 205, a second metal layer 207, a dielectric layer 209, and a metal diffusion covering layer 210. A plurality of first metal layers 205 are respectively disposed on the metal interconnection lines 200, the second metal layers 207 are respectively disposed on the first metal layers 205, a plurality of metal stacks are formed, the dielectric layer 209 is disposed on both sides of the first metal layer 205 and the second metal layer 207, that is, the dielectric layer 209 is disposed on both sides of each metal stack and has a gap with both the first metal layer 205 and the second metal layer 207, the metal diffusion covering layer 210 covers upper surfaces of the dielectric layer 209 and the second metal layer 207 to form a metal interconnection structure.

In this embodiment, by disposing the dielectric layer 209 on both sides of the first metal layer 205 and the second metal layer 207, and the dielectric layer 207 has a gap with both the first metal layer 205 and the second metal layer 207, and the formed metal interconnection structure reduces parasitic capacitance due to the gap, and the gaps existing between the first metal layer and the dielectric layer and between the second metal layer and the dielectric layer can further reduce the diffusion of metal ions to the dielectric layer.

In one possible implementation, the metal interconnection line 200 includes an insulating dielectric substrate 201, a first barrier layer 202 and a bottom metal 203. An upper surface of the insulating dielectric substrate 201 is provided with trenches disposed at intervals, the first barrier layer 202 covers an inner side surface and a bottom surface of the trench, the bottom metal 203 covers the first barrier layer 202 and fills the trench, and a first metal layer 205 is disposed on an upper surface of the bottom metal 203 to ensure the integrity of the structure. In addition, in order to further reduce the possibility of metal ions diffusion to the dielectric layer 209, the second barrier layer 208 is provided between the dielectric layer 209 and the metal interconnection line 200, so that the dielectric layer 209 and the metal interconnection line 200 are separated, and the performance of the integrated circuit is improved.

It should be noted that the transverse dimensions of both the trench and the opening are larger than a diameter of the via, which improves the integration of products and ensures the conductivity of circuits. Since copper has good electrical conductivity and low resistivity, in this embodiment, the bottom metal, the first metal layer and the second metal layer are all made of copper material.

The above is only the detail description of the embodiments of the present application, but the scope of protection of the embodiments of the present application is not limited thereto, and any change or replacement within the technical scope disclosed in the embodiments of the present application should be covered within the scope of protection of the embodiments of the present application. Therefore, the scope of protection of the embodiments of this application shall be subject to the scope of protection of the claims.

What is claimed is:

1. A manufacturing method of a metal interconnection structure, wherein manufacturing method comprises:

step S101: providing metal interconnection lines disposed at intervals;

step S102: disposing a first metal layer corresponding to the metal interconnection lines;

step S103, disposing a second metal layer on the first metal layer;

step S104: disposing a second barrier layer on the first metal layer and the second metal layer and on the metal interconnection lines; disposing a dielectric layer on the second barrier layer, and removing the second barrier layer between the second metal layers and the dielectric layer and between the first metal layer and the dielectric layer to generate an air space between the first metal layer and the dielectric layer and between the second metal layer and the dielectric layer so as to reduce a parasitic capacitance therebetweeen and further to reduce diffusion of metal ions to the dielectric layer; and step S105: covering the dielectric layer and the second metal layer with a metal diffusion covering layer.

2. The method according to claim 1, wherein the step S101 further comprises:

providing an insulating dielectric substrate, trenches distributed at intervals disposed on an upper surface of the insulating medium substrate;

generating a first barrier layer in the trenches, the first barrier layer covering a side surface and a bottom surface of the trenches; and disposing a bottom metal on the first barrier layer, and the bottom metal filling the trenches to form the metal interconnection lines.

3. The method according to claim 2, wherein the step S102 further comprises:

growing a first sacrificial layer mask on the upper surface of the metal interconnection lines, then defining a via corresponding to the metal interconnection lines on the first sacrificial layer mask, the via conducting to the metal interconnection lines; and disposing the first metal layer in the via.

4. The method according to claim 3, wherein the step S103 further comprises:

growing a second sacrificial layer mask on the first metal layer and the first sacrificial layer mask, and disposing an opening corresponding to the via on the second sacrificial layer mask, a bottom end of the opening extending to the first metal layer; and disposing the second metal layer in the opening, and the second metal layer being connected with the first metal layer.

5. The method according to claim 4, wherein the step S104 further comprises:

removing the first sacrificial layer mask and the second sacrificial layer mask, then generating a second barrier layer on surfaces of the first metal layer and the second metal layer, and on upper surfaces of the insulating dielectric substrate and the metal interconnection lines; and then generating the dielectric layer on the second barrier layer.

6. The method according to claim 5, wherein after the generating of the dielectric layer on the second barrier layer, the method further comprises:

removing the second barrier layer and the dielectric layer above the upper surface of the second metal layer, and then removing the second barrier layer between the second metal layer and the dielectric layer and between the first metal layer and the dielectric layer to form the gap.

7. The method according to claim 6, wherein transverse dimensions of both the trench and the opening are larger than a diameter of the via.

* * * * *